(12) United States Patent
Asayama

(10) Patent No.: US 7,782,658 B2
(45) Date of Patent: Aug. 24, 2010

(54) SEMICONDUCTOR DEVICE

(75) Inventor: Shinobu Asayama, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 125 days.

(21) Appl. No.: 12/252,096

(22) Filed: Oct. 15, 2008

(65) Prior Publication Data
US 2009/0103346 A1 Apr. 23, 2009

(30) Foreign Application Priority Data
Oct. 17, 2007 (JP) .............................. 2007-269706

(51) Int. Cl.
*G11C 11/00* (2006.01)
*G11C 7/00* (2006.01)
(52) U.S. Cl. ...................................... 365/154; 365/191
(58) Field of Classification Search ................. 365/154, 365/155, 156, 230.05
See application file for complete search history.

(56) References Cited

U.S. PATENT DOCUMENTS
6,856,555 B2 * 2/2005 Fujimoto ............... 365/189.07
2007/0189060 A1 * 8/2007 Inaba ......................... 365/154

FOREIGN PATENT DOCUMENTS
JP 8-7574 A 1/1996
JP 2006-209877 A 8/2006

* cited by examiner

*Primary Examiner*—Ly D Pham
(74) *Attorney, Agent, or Firm*—Sughrue Mion, PLLC

(57) ABSTRACT

There is provided a semiconductor storage device having a memory cell including a transfer transistor, a load transistor and a drive transistor, which includes a first transfer transistor to become conductive by a potential applied to a first word line placed in parallel with a pair of bit lines, a second transfer transistor to become conductive by a potential applied to a second word line placed orthogonal to the pair of bit lines, and a control circuit to output a control signal for controlling the potentials of the first word line and the second word line in such a way that the first transfer transistor becomes conductive earlier than the second transfer transistor when setting both of the first transfer transistor and the second transfer transistor to a conductive state.

6 Claims, 7 Drawing Sheets

SEMICONDUCTOR DEVICE

BACKGROUND

1. Field of the Invention

The present invention relates to a semiconductor storage device and, particularly, to a semiconductor storage device that is static random access memory (SRAM).

2. Description of Related Art

SRAM is one kind of semiconductor storage devices. FIG. 5 shows an example of a typical SRAM circuit as a related art. The SRAM 100 shown in FIG. 5 includes bit lines DT1 and DB1 to DTn and DBn. Memory cells F1 to Fn are connected respectively to the bit lines DT1 and DB1 to DTn and DBn.

Each of the memory cells F1 to Fn includes drive transistors Tr10 and Tr11, load transistors Tr20 and Tr21, and transfer transistors Tr30 and Tr31. Data that is stored in each of storage nodes A and B, which are formed at connection points between the drive transistors and the load transistors, is transferred to the bit lines DT1 and DB1 to DTn and DBn through the transfer transistors, thereby reading the data.

The operation of the SRAM is to write and read data by repeating a precharge period and a discharge period of the bit lines.

For example, the case of selecting the memory cell F1 and writing data "0" into the selected memory cell F1 is as follows. First, a precharge circuit that precharges the bit lines DT1 and DB1 to High level is turned off, and thereby the bit lines DT1 and DB1 enters a high impedance state. If, in this state, a word line WLX is set to High level, the transistors Tr30 and Tr31 are turned on, so that the bit lines DT1 and DB1 are connected to the storage nodes A and B. Because the data "0" is to be written into the memory cell F1, the bit line DT1 is set to Low level, and the bit line DB1 is set to High level. The bit line DT1 is thereby discharged. Accordingly, the storage node A becomes Low level, and the storage node B becomes High level, and thereby data writing is performed. Finally, the word line WLX is set to Low level so that the transistors Tr30 and Tr31 are turned off, and thereby data writing is completed. After that, the precharge circuit is turned on, and the bit lines DT1 and DB are precharged. Therefore, the bit line DT1 is charged to High level again.

On the other hand, the case of selecting the memory cell F1 and reading data "0" stored in the selected memory cell F1 is as follows. First, the precharge circuit that precharges the bit lines DT1 and DB1 to High level is turned off, and thereby the bit lines DT1 and DB1 enter a high impedance state. If, in this state, a word line WLX is set to High level, the transistors Tr30 and Tr31 are turned on, so that the bit lines DT1 and DB1 are connected to the storage nodes A and B. The storage node A serves as an output terminal of an inverter that is composed of the transistors Tr10 and Tr20 and an input terminal of an inverter that is composed of the transistors Tr11 and Tr21. The storage node B serves as an input terminal of the inverter that is composed of the transistors Tr10 and Tr20 and an output terminal of the inverter that is composed of the transistors Tr11 and Tr21. Because the memory cell F1 stores the data "0", the storage node A stores a Low-level potential and the storage node B stores a High-level potential. Thus, the bit line DT1 is connected to the storage node A, so that the bit line DT1 is discharged. Accordingly, the potential of the bit line DT decreases, and a potential difference from the bit line DT is amplified and read by a sense amplifier (not shown), and thereby data reading is performed. Finally, the word line WLX is set to Low level so that the transistors Tr30 and Tr31 are turned off, and thereby data reading is completed. After that, the precharge circuit is turned on, and the bit lines DT1 and DB are precharged. Therefore, the bit line DT1 is charged to High level again.

In this configuration, however, the memory cells on which data writing and reading are not performed, which are the non-selected memory cells F2 to Fn, are also connected to the same word line WLX as the selected memory cell F1. Therefore, in the non-selected memory cells F2 to Fn, unnecessary discharge and precharge are performed on the bit lines DT2 and DB2 to DTn and DBn that are respectively connected thereto. This causes an increase in power consumption of SRAM.

In light of the above issue, a technique for preventing an increase in power consumption of SRAM is disclosed in Japanese Unexamined Patent Application Publications Nos. 8-7574 and 2006-209877, for example. They describe the SRAM 110 in which a transistor Tr40 is inserted between the transfer transistor Tr30 and the bit line DT and a transistor Tr41 is inserted between the transfer transistor Tr31 and the bit line DB in the memory cell F1 of FIG. 5, as shown in FIG. 6. Further, a Y-decoder 601 controls the potential level of word lines WLY1 to WLYn that are connected to the gates of the transistors Tr40 and T41 and turns on and off the transistors Tr40 and T41 of each memory cell.

FIG. 7 shows a timing chart of the SRAM circuit shown in FIG. 6. It is the timing chart of the operation of writing data "0" into the memory cell F1 and the operation of reading data "0" stored in the memory cell F1. As shown in FIG. 7, the potential of the word line WLX rises to High level and the potential of the word line WLY1 also rises to High level at the same time, so that the transistors Tr30, Tr40, Tr31 and Tr41 of the selected memory cell F1 are turned on. As a result, the storage nodes A and B are connected to the bit lines DT and DB, and thereby data reading and reading are performed.

Because the potentials of the word lines WLY2 to WLYn remain Low level, the transistors Tr40 and Tr41 of the non-selected memory cells F2 to Fn stay off. Thus, discharge and precharge are performed on the bit line DT1 only. Accordingly, discharge of the bit lines that are connected to the non-selected memory cells F2 to Fn is not performed, and the precharge circuit is kept on. This thus eliminates unnecessary discharge and charge of the bit lines connected to the non-selected memory cells, thereby preventing an increase in power consumption of SRAM.

However, in the SRAM circuit shown in FIG. 6, the bit lines DT1 and DB1 to DTn and DBn and the word lines WLY1 to WLYn are formed in parallel with each other on a semiconductor chip. Therefore, a change in the potential of the word line WLY1, for example, causes crosstalk into the bit lines DT1 and DB1, which adversely affects a change in the potentials of the bit lines for data output.

In the SRAM circuit 110, the Y-decoder 601 to which the word lines WLY1 to WLYn are connected and an X-decoder 602 to which the word line WLX is connected start operating at the same time. In such a case, immediately after the potential of the word line WLY1 rises from Low level to High level, the transfer transistors Tr40 and Tr41 that are connected to the word line WLY1 discharge one of the bit lines DT1 and DB1 to reduce the potential according to the stored data in the selected memory cell.

For example, the case of reading data "0" stored in the memory cell F1 described above is as follows. When the potential of the word line WLX rises to High level and the potential of the word line WLY1 also rises to High level at the same time, the potential of the bit line DT1 falls to Low level immediately after that timing. At this time, due to the crosstalk from the word line WLY1 whose potential rises to High level as described above, the potential of the bit line DT1 is hard to fall. Further, due to the crosstalk of the potential of the bit line DT1 falling to Low level into the word line WLY1, the potential of the word line WLY1 is hard to rise.

On the other hand, in the case of writing data "0" into the memory cell F1, a buffer in the Y-decoder 601 changes the potential of the bit line DT1 to Low level. At this time, the crosstalk at the falling of the potential of the bit line DT1 causes the potential of the word line WLY1 to be hard to rise. In this manner, crosstalk occurs between the bit lines DT1 and DB1 to DTn and DBn and the word lines WLY1 to WLYn placed in parallel therewith due to a change in their potentials, causing a delay in rising and falling of the potential level.

SUMMARY

The present inventors have found a problem that a delay occurs at the rising of the potential level of the word line WLY1 placed in parallel with the bit line and at the falling of the potential level of the bit line according to the prior art. This leads to a failure to obtain a differential potential that is necessary for a sense amplifier that amplifies a potential difference between the bit lines DT and DB within a limited time of the reading period, causing false data reading in the SRAM circuit.

A first exemplary aspect of an embodiment of the present invention is a semiconductor storage device having a memory cell including a transfer transistor, a load transistor and a drive transistor, which includes a first transfer transistor to become conductive by a potential applied to a first word line placed in parallel with a bit line, a second transfer transistor to become conductive by a potential applied to a second word line placed orthogonal to the bit line, and a control circuit to output a control signal for controlling the potentials of the first word line and the second word line in such a way that the first transfer transistor becomes conductive earlier than the second transfer transistor when setting both of the first transfer transistor and the second transfer transistor to a conductive state.

In the semiconductor storage device according to an exemplary embodiment of the present invention, a potential is first applied to the first word line that is placed in parallel with the bit line, so that the first transfer transistor becomes conductive. After that, a potential is applied to the second word line placed orthogonal to the bit line, so that the second transfer transistor becomes conductive. Therefore, when the second transfer transistor becomes conductive and a change in the potential of the bit line starts by stored data in a selected memory cell, a change in the potential of the first word line to which a potential is applied first already ends, and it is thus not affected by the bit line due to crosstalk. Accordingly, a delay in a change in the potential of the bit line due to crosstalk between the first word line and the bit line does not occur, and it is thereby possible to obtain a differential potential necessary for a sense amplifier that amplifies a potential difference in the bit line within a reading period.

The semiconductor storage device according to an exemplary embodiment of the present invention can prevent a problem that causes false data reading in an SRAM circuit.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
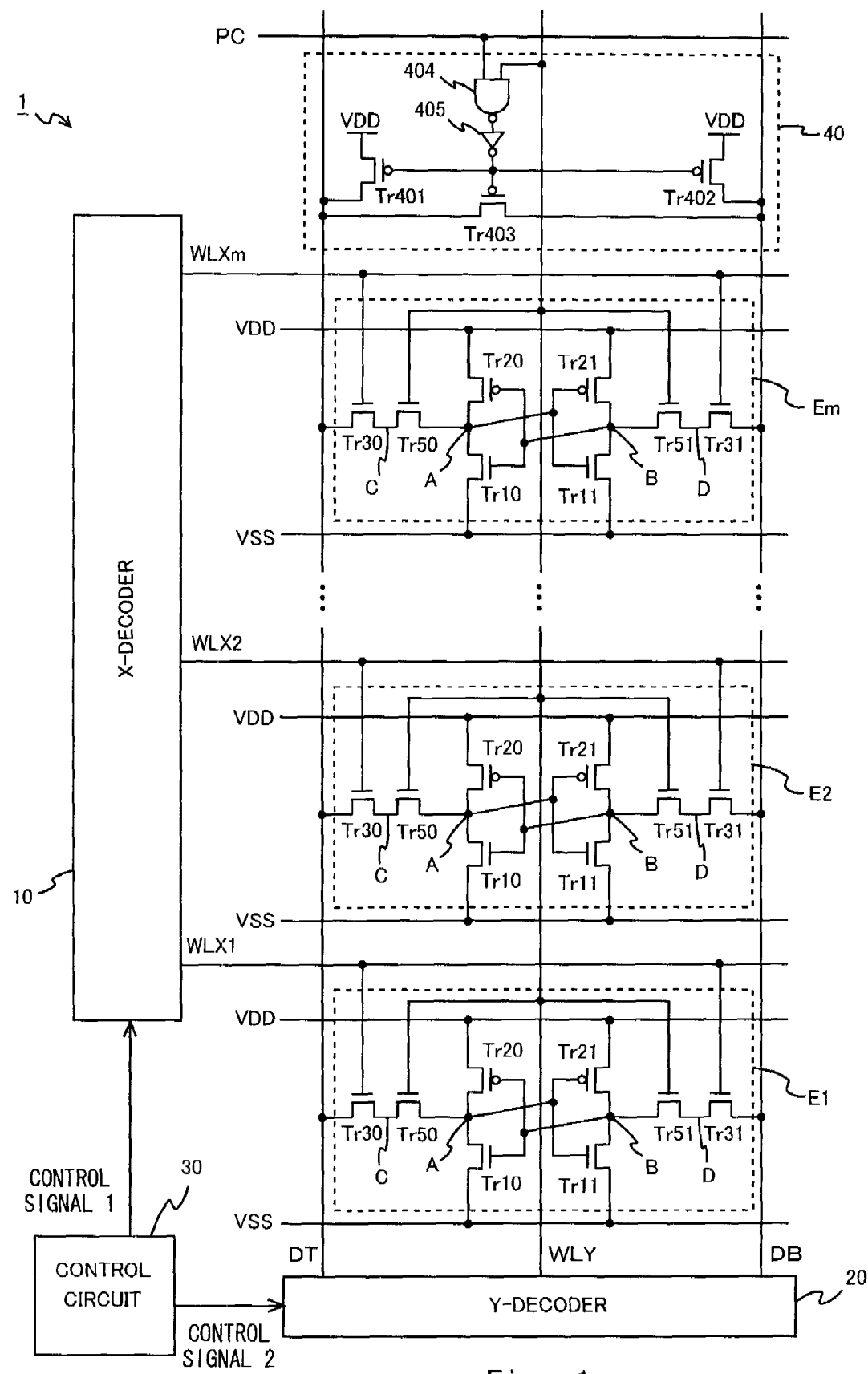
FIG. 1 is a circuit diagram of SRAM according to an exemplary embodiment of the present invention.

An exemplary embodiment of the present invention will be described hereinafter with reference to the drawings. In this exemplary embodiment, SRAM is explained as an example of a semiconductor storage device. FIG. 1 shows a circuit diagram of the SRAM 1. Referring to FIG. 1, in the SRAM 1, a plurality of memory cells E1 to Em are connected to a pair of bit lines DT and DB.

In this exemplary embodiment, the memory cells E1 to Em are connected to one pair of bit lines. The SRAM 1 includes second word lines (word lines WLX1 to WLXm) that are placed orthogonal to the pair of bit lines and an X-decoder 10 that drives the word lines WLX1 to WLXm. The SRAM 1 also includes a first word line (word line WLY) that is placed in parallel with the pair of bit lines and a Y-decoder 20 that drives the word line WLY. The word lines WLX1 to WLXm are connected respectively to the memory cells E1 to Em, and the word line WLY is connected to all of the memory cells E1 to Em.

In this exemplary embodiment, the X-decoder 10 drives one of the word lines WLX1 to WLXm from Low level to High level and the Y-decoder 20 drives the word line WLY from Low level to High level to thereby select an arbitrary memory cell from the memory cells E1 to Em, and data writing and reading are performed on the selected memory cell.

The SRAM 1 further includes a precharge circuit 40 that is connected to the word line WLY and precharges the bit lines DT and DB to a constant potential. The precharge circuit 40 includes PMOS transistors Tr401, Tr402 and Tr403, an inverter 405, and a NAND circuit 404. One input terminal of the NAND circuit 404 is connected to a control line PC, and the other input terminal of the NAND circuit 404 is connected to the word line WLY. The input terminal of the inverter 405 is connected to the output terminal of the NAND circuit 404. The gates of the transistors Tr401, Tr402 and Tr403 are connected to the output terminal of the inverter 405. The drains of the transistors Tr401 and Tr402 are respectively connected to the bit lines DT and DB, and the sources of the transistors Tr401 and Tr402 are connected to a power supply node VDD. The source and the drain of the transistor Tr403 are connected to the power supply node VDD.

Thus, when either one of the word line WLY and the control line PC is Low level, the precharge circuit 40 of this exemplary embodiment precharges the bit lines DT and DB to a power supply voltage VDD as a constant potential. Consequently, the power supply node VDD becomes a constant potential node. The constant potential is not limited to the power supply voltage VDD as long as it is the same as a voltage value when the logical value of the bit line DT or DB is High level.

The SRAM 1 further includes a control circuit 30. The control circuit 30 outputs a control signal 1 to the X-decoder 10. According to the control signal 1, the timing when the X-decoder 10 applies a Low level/High level potential to one of the word lines WLX1 to WLXm is controlled. Further, the control circuit 30 outputs a control signal 2 to the Y-decoder 20. According to the control signal 2, the timing when the Y-decoder 20 applies a Low level/High level potential to the word line WLY is controlled. By the control signal 1 and the control signal 2, the timing when the potential of one of the word lines WLX1 to WLXm changes from Low level to High level is delayed by a predetermined time T behind the timing when the potential of the word line WLY changes from Low level to High level. The length of the delay time T is at least the length of time that is necessary for the potential of the word line WLY to rise from Low level (e.g. the same voltage as the ground voltage VSS) to High level (e.g. the same voltage as the power supply voltage VDD).

For example, the delay time T may be generated by a time difference between the timing when the control signal 2 is input to the Y-decoder 20 and the timing when the control signal 1 is input to the X-decoder 10. An exemplary method is that the control circuit 30 makes the output of the control signal 1 delay behind the output of the control signal 2 using an inverter delay, a line capacitance delay or the like.

The SRAM 1 reads the data stored in the selected memory cell by detecting a potential difference that occurs between the bit lines DT and DB according to the data stored in the selected memory cell using a sense amplifier (not shown).

The memory cells E1 to Em have the identical configuration, and the memory cell E1 is explained as an example. The memory cell E1 includes drive transistors Tr10 and Tr11, load transistors Tr20 and Tr21, first transfer transistors Tr50 and Tr51, and second transfer transistors Tr30 and Tr31. In this exemplary embodiment, the drive transistors Tr10 and Tr11, the first transfer transistors Tr50 and Tr51, and the second transfer transistors Tr30 and Tr31 are NMOS transistors, and the load transistors Tr20 and Tr21 are PMOS transistors.

The drive transistor Tr10 and the load transistor Tr20 are connected in series between the power supply node VDD through which the power supply voltage VDD is supplied and the ground node VSS through which the ground voltage VSS is supplied. The gate of the drive transistor Tr10 and the gate of the load transistor Tr20 are commonly connected. A connection point between the drain of the drive transistor Tr10 and the drain of the load transistor Tr20 serves as a storage node A.

The drive transistor Tr11 and the load transistor Tr21 are connected in series between the power supply node VDD and the ground node VSS. The gate of the drive transistor Tr11 and the gate of the load transistor Tr21 are commonly connected. A connection point between the drain of the drive transistor Tr11 and the drain of the load transistor Tr21 serves as a storage node B.

The storage node A is connected to the gates of the drive transistor Tr11 and the load transistor Tr21. The storage node B is connected to the gates of the drive transistor Tr10 and the load transistor Tr20.

The first transfer transistor Tr50 is connected to the storage node A. The second transfer transistor Tr30 is connected between the first transfer transistor Tr50 and the bit line DT. Thus, the first transfer transistor Tr50 and the second transfer transistor Tr30 are connected in series between the storage node A and the bit line DT. A connection point between the first transfer transistor Tr50 and the second transfer transistor Tr30 is referred to hereinafter as a transfer node C.

The first transfer transistor Tr51 is connected to the storage node B. The second transfer transistor Tr31 is connected between the first transfer transistor Tr51 and the bit line DB. Thus, the first transfer transistor Tr51 and the second transfer transistor Tr31 are connected in series between the storage node B and the bit line DB. A connection point between the first transfer transistor Tr51 and the second transfer transistor Tr31 is referred to hereinafter as a transfer node D.

The gates of the first transfer transistors Tr50 and Tr51 are both connected to the word line WLY that is placed in parallel with the bit lines DT and DB. The word line WLY is driven by the Y-decoder 20 as described above, and a High-level or Low-level potential is applied thereto, thereby controlling the conductive or non-conductive state of the first transfer transistors Tr50 and Tr51.

The gates of the second transfer transistors Tr30 and Tr31 are both connected to the word line WLX1 that is placed orthogonal to the bit lines DT and DB. The word line WLX1 is driven by the X-decoder 10 as described above, and a High-level or Low-level potential is applied thereto, thereby controlling the conductive or non-conductive state of the second transfer transistors Tr30 and Tr31.

In the memory cell E1, when the word line WLY is High level and the word line WLX1 is High level, the first transfer transistors Tr50 and Tr51 and the second transfer transistors Tr30 and Tr31 are both in the conductive state. Thus, when the word line WLY and the word line WLX1 are both High level, the bit lines DT and DB are connected to the storage nodes A and B, so that the SRAM 1 can perform data writing and reading on the memory cell E1.

Data writing and reading operation in the SRAM 1 according to this exemplary embodiment is described hereinafter. The case of reading data "0" into the memory cell E1 and reading data "0" stored in the memory cell E1 is described below. The state where the memory cell E1 stores data "0" means that the storage node A stores Low level (e.g. the same voltage value as the ground voltage VSS) and the storage node B stores High level (e.g. the same voltage value as the power supply voltage VDD).

Figure 2:
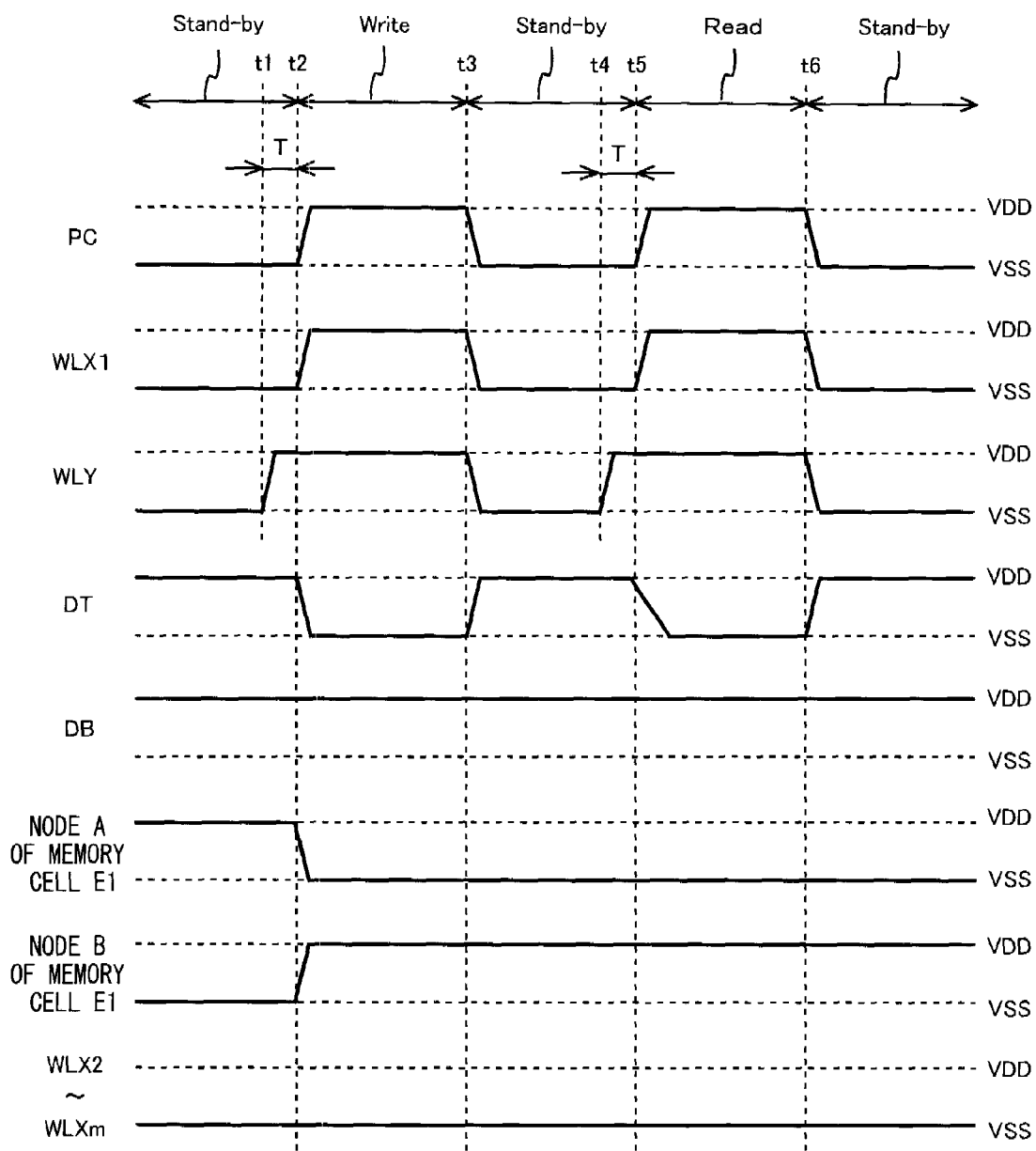
FIG. 2 is a timing chart of writing and reading operation of SRAM an exemplary embodiment of the present invention.

FIG. 2 shows a timing chart of the writing and reading operation on the memory cell E1 in the SRAM 1. Data writing into the memory cell E1 is performed during the period from the timing t2 to t3 when the word line WLX1 and the word line WLY are both High level. Data reading from the memory cell E1 is performed during the period from the timing t5 to t6 when the word line WLX1 and the word line WLY are both High level. In the SRAM 1, during the period when no access is made to the memory cell, the bit lines DT and DB are precharged by the precharge circuit 40. Specifically, during the periods different from the writing period from the timing t2 to t3 and the reading period from the timing t5 to t6, the potential of either one of the word line WLY and the control line PC is Low level, and the pair of bit lines are precharged by the precharge circuit 40. A precharge voltage in this exemplary embodiment is the same voltage value as the power supply node VDD.

At the timing t1, the potential of the word line WLY rises from Low level to High level. The first transfer transistors Tr50 and Tr51 of the memory cell E1 thereby become conductive. On the other hand, the second transfer transistors Tr30 and Tr31 remain non-conductive because the potential of the word line WLX1 is Low level. Thus, the bit lines DT and DB are electrically disconnected from the storage nodes A and B, and data writing into the memory cell E1 is not performed. Further, because the control line PC is also Low level, the bit lines DT and DB are precharged by the precharge circuit 40.

Next, at the timing t2 that is after the period T from the timing t1, which is after a sufficient length of time for the word line WLY to change from Low level to High level, the potential of the word line WLX1 rises from Low level to High level. The second transfer transistors Tr30 and Tr31 of the memory cell E1 thereby become conductive. Therefore, the first transfer transistors Tr50 and Tr51 and the second transfer transistors Tr30 and Tr31 of the memory cell E1 are both in the conductive state. Concurrently, the control line PC also rises to High level, so that the precharge circuit 40 stops operating. Further, a Low-level potential is applied to the bit line DT, and a High-level potential is applied to the bit line DB for data writing. As a result, the bit lines DT and DB are electrically connected to the storage nodes A and B, and the Low level of the bit line DT and the High level of the bit line DB are transferred to the storage nodes A and B of the memory cell E1. Accordingly, the potential of the storage node A falls and the potential of the storage node B rises, thereby writing data into the memory cell E1.

Then, at the timing t3, the word line WLY and the word line WLX1 both fall from High level to Low level. The first transfer transistors Tr50 and Tr51 and the second transfer transistors Tr30 and Tr31 of the memory cell E1 thereby both become non-conductive. As a result, the bit lines DT and DB are electrically disconnected from the storage nodes A and B. Concurrently, the control line PC also falls to Low level, so that the precharge circuit 40 starts operating, and the bit lines DT and DB are precharged. The writing operation is performed as described in the foregoing.

The reading operation is described in the following. At the timing t4, the potential of the word line WLY rises from Low level to High level. The first transfer transistors Tr50 and Tr51 of the memory cell E1 thereby become conductive. On the other hand, the second transfer transistors Tr30 and Tr31 remain non-conductive because the potential of the word line WLX1 is Low level. Thus, the bit lines DT and DB are electrically disconnected from the storage nodes A and B, and data reading from the memory cell E1 is not performed. Further, because the control line PC is also Low level, the bit lines DT and DB are precharged by the precharge circuit 40.

Next, at the timing t5 that is after the period T from the timing t4, which is after a sufficient length of time for the word line WLY to change from Low level to High level, the potential of the word line WLX1 rises from Low level to High level. The second transfer transistors Tr30 and Tr31 of the memory cell E1 thereby become conductive. Therefore, the first transfer transistors Tr50 and Tr51 and the second transfer transistors Tr30 and Tr31 of the memory cell E1 are both in the conductive state. As a result, the bit lines DT and DB are electrically connected to the storage nodes A and B. Concurrently, the control line PC also rises to High level, so that the precharge circuit 40 stops operating. Because the storage node A is Low level, the bit line DT is discharged and the potential thereby decreases. On the other hand, the potential of the bit line DB does not change because the storage node B and the bit line DB are both High level.

Then, at the timing t6, the word line WLY and the word line WLX1 both fall from High level to Low level. The first transfer transistors Tr50 and Tr51 and the second transfer transistors Tr30 and Tr31 of the memory cell E1 thereby both become non-conductive. As a result, the bit lines DT and DB are electrically disconnected from the storage nodes A and B. Concurrently, the control line PC also falls to Low level, so that the precharge circuit 40 starts operating, and the bit lines DT and DB are precharged. The reading operation is performed as described in the foregoing.

The period T from the timing t1 to t2 (which is referred to hereinafter as the period Tb) and the period T from the timing t4 to t5 (which is referred to hereinafter as the period Ta) do not necessarily have the same length. The length of the periods Ta and Tb depends on the number of the memory cells E1 to Em that are connected to the word line WLY and, more specifically, on the gate capacitance of the first transfer transistors Tr50 and Tr51 of each memory cell, the parasitic capacitance and the line resistance of the word line WLY, the current supply capacity of a drive in the Y-decoder 20 and so on. Therefore, the length of time necessary for the periods Ta and Tb may be at least the length of time that is necessary for the potential of the word line WLY to rise from Low level to High level.

The SRAM 1 of this exemplary embodiment includes the m-number of memory cells in one row. However, the SRAM 1 may include the n-number of pairs of bit lines DT1 and DB1 to DTn and DBn and the word lines WLY1 to WLYn in the row direction and the m-number of memory cells connected thereto, so that the memory cells are arranged in the n-by-m matrix. In such a case, the precharge circuit 40 corresponding to the bit lines DT1 and DB1 to DTn and DBn is driven by the word lines WLY1 to WLYn that are connected to the Y-decoder 20. The configuration of the SRAM 1, however, is not limited thereto, and the SRAM 1 may have a circuit configuration in which precharge is turned off only in the pair of bit lines of the selected rows from the n-number of rows by a signal in synchronization with the Y-decoder 20, and precharge is kept on in the pair of bit lines of the non-selected rows.

As described in the foregoing, when performing writing and reading on the selected memory cell in the SRAM 1 according to this exemplary embodiment, the SRAM 1 makes control in such a way that the potential of the word line WLY that is placed in parallel with the bit lines DT and DB rises from Low level to High level before the potential of either one of the word lines WLX1 to WLXm that are placed orthogonal to the bit lines DT and DB rises from Low level to High level. Specifically, by the time when the potential of either one of the word lines WLX1 to WLXm rises from Low level to High level and thereby one of the bit lines DT and DB is discharged and the potential starts decreasing, the potential of the word line WLX1 has already become High level, which is the power supply voltage VDD (or the potential substantially the same as the power supply voltage VDD). The power supply voltage VDD is supplied from a voltage source that generates a stable voltage through the power supply node VDD. Thus, even when the potential of the bit line DT or DB decreases, the word line WLY is kept to the stable power supply voltage VDD. Therefore, the crosstalk into the word line WLY that is placed in parallel with the bit lines DT and DB at the falling of the bit line, which is a problem in the above-described prior art, does not occur. Accordingly, a delay at the rising of the potential level of the word line WLY or at the falling of the potential level of the bit line DT or DB, which is also a problem in the above-described prior art, does not occur as well. It is thereby possible to obtain a differential potential that is necessary for a sense amplifier that amplifies a potential difference between the bit lines DT and DB within a limited time of the reading period, thereby reducing the possibility of false data reading in the SRAM 1.

In data writing, a buffer in the Y-decoder 20 changes the potential of one of the bit lines DT and DB to Low level. At this time, according to the above-described prior art, the potential of the word line WLY1 is hard to rise by the crosstalk due to the falling of the potential of the bit line DT or DB. However, in the SRAM 1 according to this exemplary embodiment, the potential of the word line WLY has already become High level, which is the power supply voltage VDD, by the time of the falling of the potential of one of the bit lines DT and DB just like the case of data reading, and therefore the crosstalk does not occur.

Figure 3A:
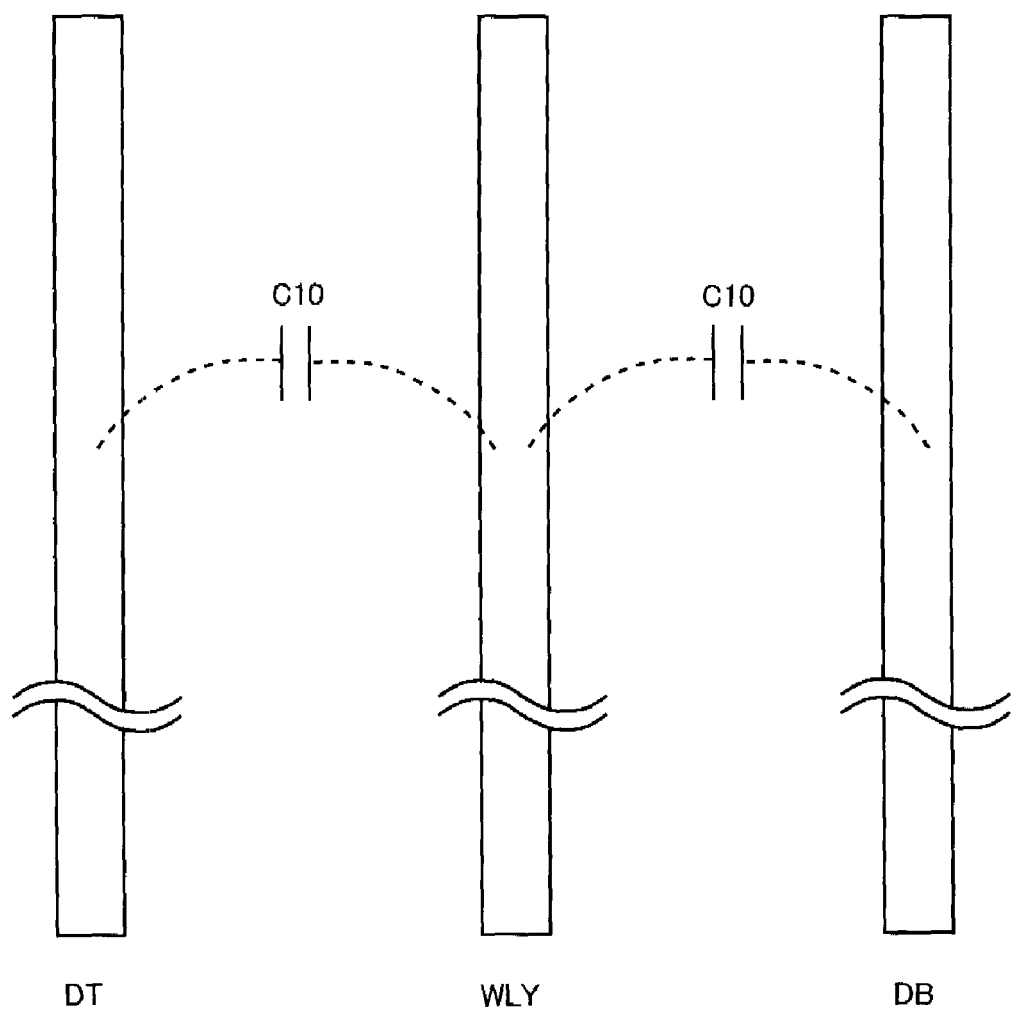
FIG. 3A is a schematic top view showing the positional relationship among a word line and bit lines an exemplary embodiment of the present invention.
Figure 3B:
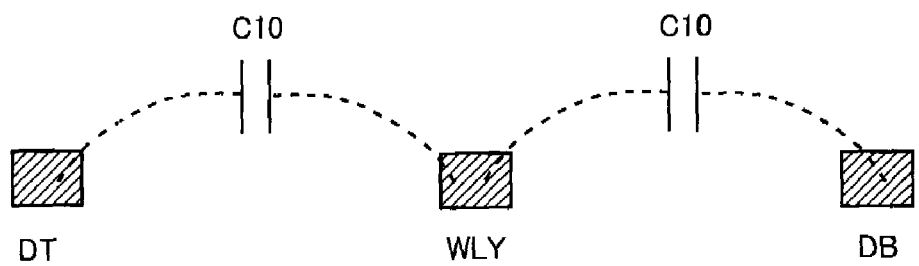
FIG. 3B is a schematic cross-sectional view showing the positional relationship among a word line and bit lines an exemplary embodiment of the present invention.

FIGS. 3A and 3B are the schematic views showing the positional relationship among the word line WLY and the bit lines DT and DB in the SRAM 1 according to this exemplary embodiment. FIG. 3A is a top view (or a bottom view), and FIG. 3B is a cross-sectional view. FIGS. 3A and 3B show the case where the word line WLY is placed between the bit lines DT and DB in the same layer. The word line WLY, however, is not necessarily placed between the bit lines DT and DB at equal distances in the same layer as shown in FIGS. 3A and 3B, as long as the word line WLY is placed between bit lines DT and DB with respect to the extending direction of the word lines WLX1 to WLXm. A parasitic capacitance C10 exists between the word line WLY and the bit line DT or the bit line DB. Due to the parasitic capacitance C10, the crosstalk occurs at the falling edge and the rising edge of the bit line in the prior art.

As described in the foregoing, the potential of the word line WLY already reaches High level, which is the power supply voltage VDD, before either one of the bit lines DT and DB changes to Low level following the rising of the word line WLY to High level. Therefore, the word line WLY has the same potential as the stable power supply voltage VDD, and thus less likely to be affected by noise. Further, because the potential of either one of the bit lines DT and DB becomes to Low level when the word line WLY rises to High level, the crosstalk occurs between the bit lines DT and DB. However, because the word line WLY at the same potential as the stable power supply voltage VDD exists between the bit lines DT and DB, the word line WLY serves as a shield (which is referred to hereinafter as a VDD shield) between the bit lines DT and DB. Because of the VDD shield, it is possible to reduce an unnecessary change in potential for the sense amplifier due to the crosstalk between the bit lines DT and DB, thereby reducing the possibility of false data reading in the SRAM 1.

Figure 4A:
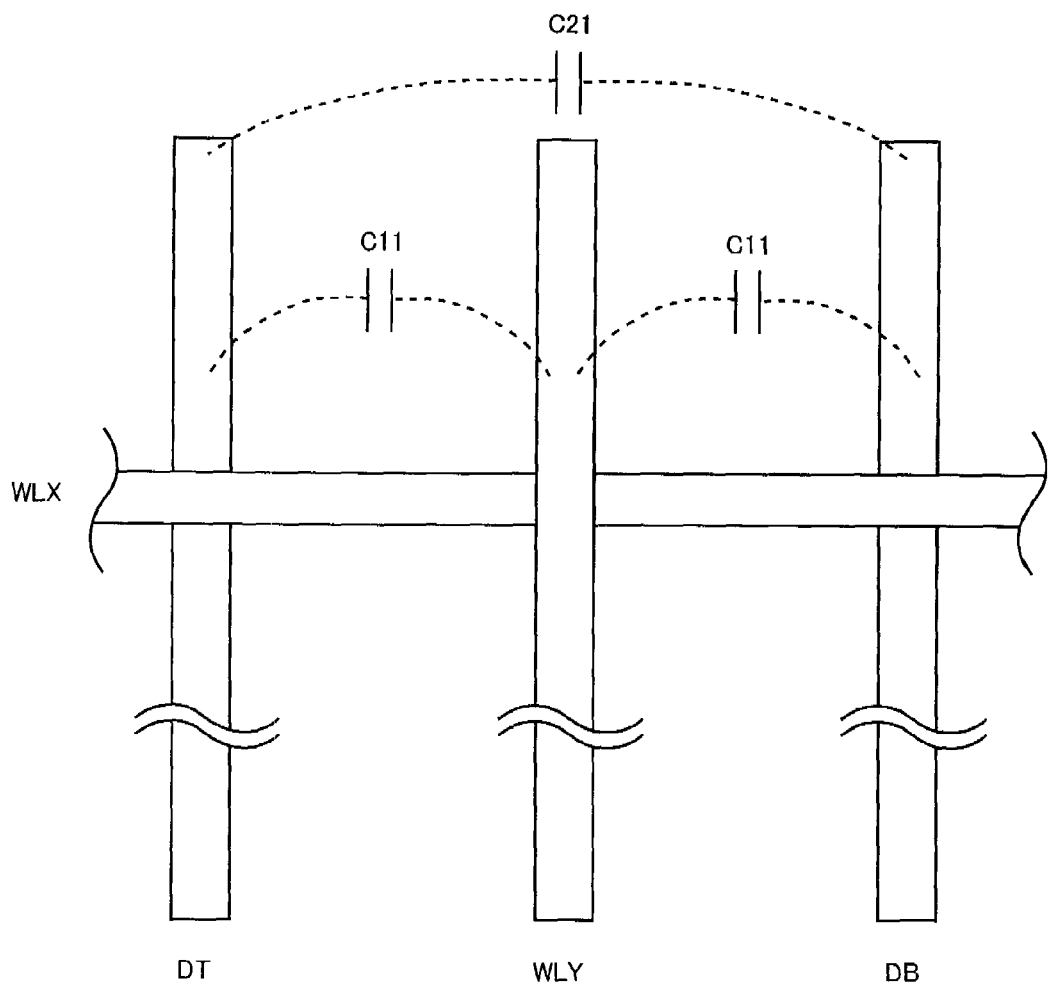
FIG. 4A is a schematic top view showing the positional relationship among a word line and bit lines an exemplary embodiment of the present invention.
Figure 4B:
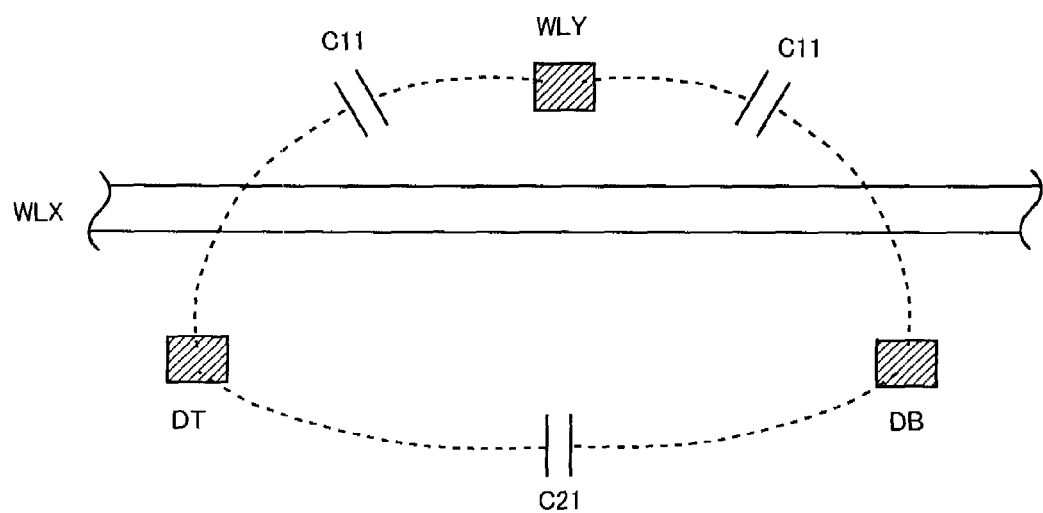
FIG. 4B is a schematic cross-sectional view showing the positional relationship among a word line and bit lines an exemplary embodiment of the present invention.
Figure 5:
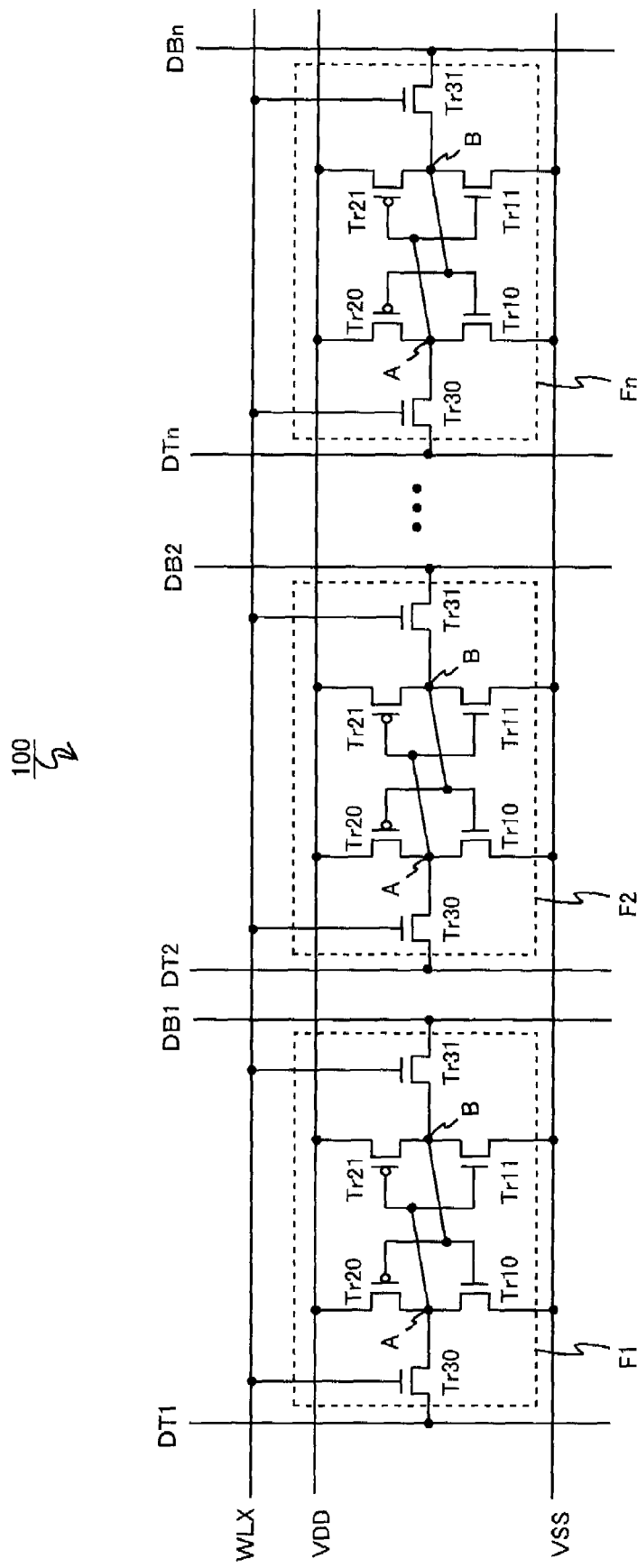
FIG. 5 is a circuit diagram of typical SRAM.

FIGS. 4A and 4B are the schematic views showing the case where the word line WLY is not placed between the bit lines DT and DB. Like FIGS. 3A and 3B, FIG. 4A is a top view (or a bottom view), and FIG. 4B is a cross-sectional view. If the word line WLY is not placed between the bit lines DT and DB as shown in FIGS. 4A and 4B, the word line WLY cannot be used as the VDD shield. However, because the timing when the potential of the word line WLY start changing is earlier than the timing when the potential of the bit line starts changing by the time T, the crosstalk between the bit line and the word line WLY is negligible.

Consider, for example, the case where the memory cell E1 is a selected memory cell and it stores data "0". First, when the potentials of the word line WLX1 and the word line WLY are both Low level, the potential of the transfer node C, which is a node between the first transfer transistor Tr50 and the second transfer transistor Tr30, is a floating potential. Because the potential of the word line WLY rises from Low level to High level earlier than the potential of the word line WLX1 by the time T, the first transfer transistors Tr50 and Tr51 become conductive earlier than the second transfer transistors Tr30 and Tr31 in the memory cell E1. Accordingly, the potential of the transfer node C becomes the ground voltage VSS before the potential of the word line WLX1 rises to High level. After that, the potential of the word line WLX1 rises to High level, and thereby the second transfer transistor Tr30 is electrically connected to the bit line DT. Thus, compared with the case where the potential of the word line WLX1 rises to High level earlier than the potential of the word line WLY, the change in the potential of the bit line DT is made rapidly by the amount of the parasitic capacitance between the first transfer transistor Tr50 and the second transfer transistor Tr30. This indicates the effectiveness by that the potential of the word line WLY rises to High level earlier than the potential of the word line WLX1 in addition to the effect of the VDD shield that reduces the crosstalk between the bit lines.

As for the effect of the VDD shield that reduces the crosstalk described above, the circuit configuration is not necessarily the one shown in FIG. 1. Specifically, instead of the configuration where the first transfer transistors Tr50 and Tr51 whose gates are connected to the word line WLY are placed respectively between the storage nodes A and B and the transfer nodes C and D, the first transfer transistors Tr50 and Tr51 may be connected to the bit lines DT and DB.

Figure 6:
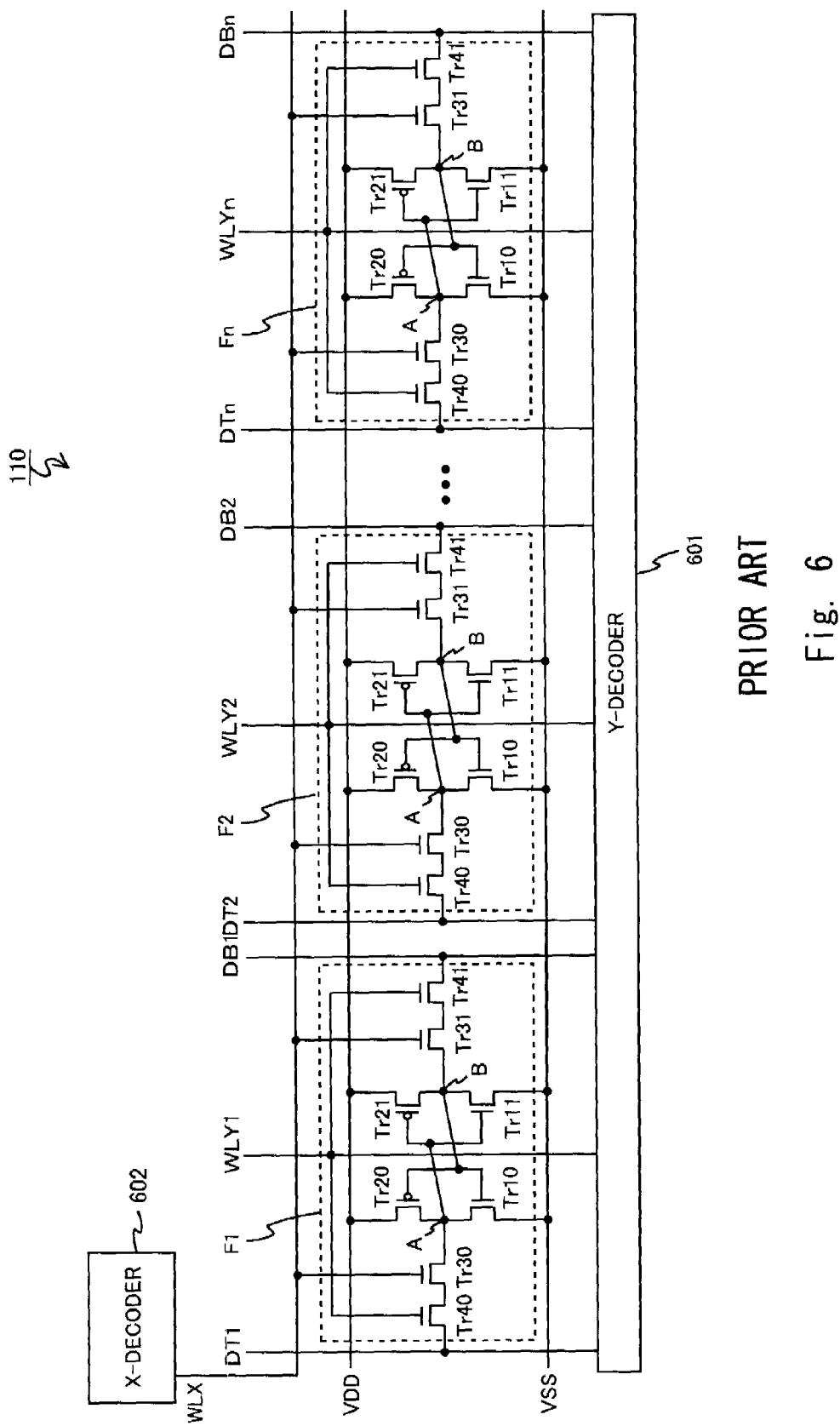
FIG. 6 is a circuit diagram of SRAM according to a prior art.
Figure 7:
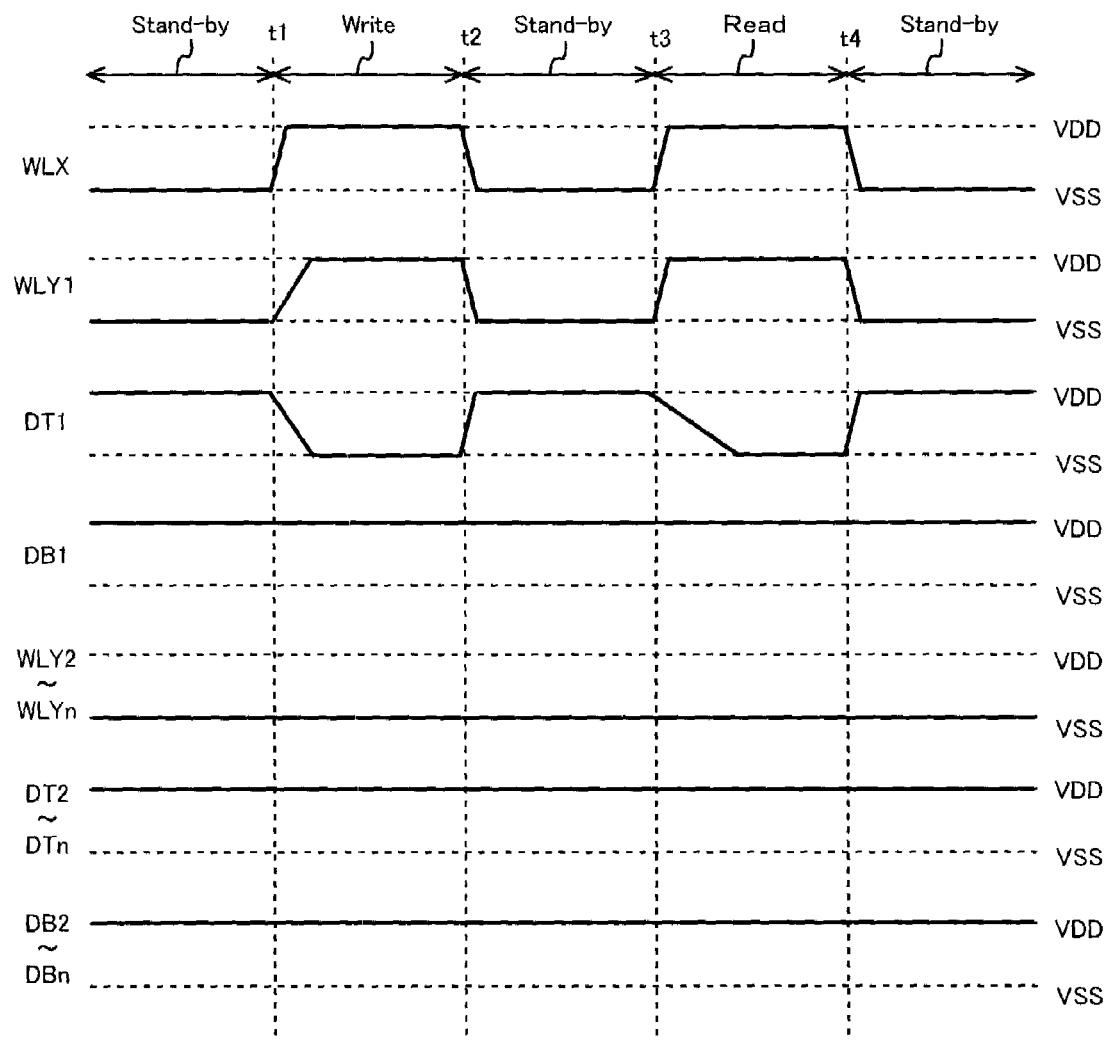
FIG. 7 is a timing chart of writing and reading operation of SRAM according to a prior art.

Consider, as a comparative example, the case where the circuit configuration of a plurality of memory cells that are connected to the bit lines DT and DB is such that the first transfer transistors Tr50 and Tr51 are connected closer to the bit lines DT and DB, and the second transfer transistors Tr30 and Tr31 are connected closer to the storage nodes A and B in each memory cell just like the memory cell in the prior art shown in FIG. 6.

The potential of the transfer nodes C and D, which is a potential between the first transfer transistors Tr50 and Tr51 and the second transfer transistors Tr30 and Tr31 in the non-selected memory cell, is a floating potential. The level of the potential is determined by the stored data in the memory cell and the leakage current of the first and second transfer transistors Tr50, Tr51, Tr30 and Tr31.

If the potential of the word line WLY rises to High level earlier than the potential of either one of the word lines WLX1 to WLXm while the potential of the transfer nodes C and D is a floating potential, the second transfer transistors Tr30 and Tr31 of all the memory cells that are connected to the bit lines DT and DB become conductive. A charge corresponding to the parasitic capacitance between the first transfer transistors Tr50 and Tr51 and the second transfer transistors Tr30 and Tr31 is thereby subtracted from the bit line that maintains High level in the high impedance state, causing the potential of the bit lines DT and DB to become unstable. Therefore, even if data reading from the memory cell is started by either one of the word lines WLX that rises to High level after a delay, a loss occurs in a potential difference that is necessary for the sense amplifier.

For the reason described above, the circuit configuration in which the second transfer transistors Tr30 and Tr31 are placed closer to the bit lines DT and DB, and the first transfer transistors Tr50 and Tr51 are placed closer to the storage nodes A and B in each memory cell as shown in FIG. 1 is preferred compared with the circuit configuration in which the first transfer transistors Tr50 and Tr51 are placed closer to the bit lines DT and DB, and the second transfer transistors Tr30 and Tr31 are placed closer to the storage nodes A and B in each memory cell like the memory cell shown in FIG. 6.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor storage device having a memory cell including a transfer transistor, a load transistor and a drive transistor, comprising:
   a first transfer transistor to become conductive by a potential applied to a first word line placed in parallel with a pair of bit lines;
   a second transfer transistor to become conductive by a potential applied to a second word line placed orthogonal to the pair of bit lines; and
   a control circuit to output a control signal for controlling the potentials of the first word line and the second word line in such a way that the first transfer transistor becomes conductive earlier than the second transfer transistor when setting both of the first transfer transistor and the second transfer transistor to a conductive state.

2. The semiconductor storage device according to claim 1, wherein
   the first transfer transistor is connected to a connection point between the load transistor and the drive transistor, and
   the second transfer transistor is connected between the first transfer transistor and a bit line.

3. The semiconductor storage device according to claim 1, wherein
   the first word line is placed between the pair of bit lines with respect to an extending direction of the second word line.

4. The semiconductor storage device according to claim 1, wherein
   the first word line is placed in the same layer as the pair of bit lines.

5. The semiconductor storage device according to claim 1, wherein
   the first transfer transistor becomes conductive earlier than the second transfer transistor at least by a period necessary for a potential level of the first word line to rise to High level.

6. The semiconductor storage device according to claim 1, wherein
   a plurality of memory cells each including the first transfer transistor and the second transfer transistor are connected to one pair of bit lines.

* * * * *